(12) United States Patent
Matsutori (10) Patent No.: US 7,077,270 B2
(45) Date of Patent: Jul. 18, 2006

(54) THIN PLATE STORAGE CONTAINER WITH SEAL AND COVER FIXING MEANS

(75) Inventor: Chiaki Matsutori, Tokyo (JP)

(73) Assignee: Miraial Co., Ltd., Tokyo (JP)

( * ) Notice: Subject to any disclaimer, the term of this patent is extended or adjusted under 35 U.S.C. 154(b) by 156 days.

(21) Appl. No.: 10/796,114

(22) Filed: Mar. 10, 2004

(65) Prior Publication Data

US 2005/0199529 A1    Sep. 15, 2005

(51) Int. Cl.
B65D 85/48 (2006.01)
B65D 45/28 (2006.01)

(52) U.S. Cl. .................... 206/710; 206/1.5; 206/454; 206/711

(58) Field of Classification Search ........ 206/710–711, 206/454, 712, 1.5; 220/323
See application file for complete search history.

(56) References Cited

U.S. PATENT DOCUMENTS

| | | | | |
|---|---|---|---|---|
| 5,740,845 A | * | 4/1998 | Bonora et al. | 206/710 |
| 5,873,468 A | * | 2/1999 | Ejima et al. | 206/711 |
| 5,988,392 A | * | 11/1999 | Hosoi | 206/711 |
| 6,032,802 A | * | 3/2000 | Ejima et al. | 206/711 |
| 6,105,781 A | * | 8/2000 | Ejima et al. | 206/710 |
| 6,105,782 A | * | 8/2000 | Fujimori et al. | 206/710 |
| 6,382,419 B1 | * | 5/2002 | Fujimori et al. | 206/454 |
| 6,457,598 B1 | * | 10/2002 | Hsieh et al. | 220/323 |
| 6,622,883 B1 | * | 9/2003 | Wu et al. | 206/710 |
| 6,663,148 B1 | * | 12/2003 | Bonora et al. | 206/710 |
| 6,880,718 B1 | * | 4/2005 | Eggum | 206/710 |
| 6,902,063 B1 | * | 6/2005 | Pai et al. | 206/710 |

FOREIGN PATENT DOCUMENTS

| | | |
|---|---|---|
| JP | 10-070184 | 3/1998 |
| JP | 11-091865 | 4/1999 |
| JP | 11-159218 | 6/1999 |
| JP | 2000-039006 | 2/2000 |
| JP | 2001-512288 | 8/2001 |
| JP | 2003-174080 | 6/2003 |
| WO | 98/56676 | 12/1998 |
| WO | 03/010069 | 7/2001 |

* cited by examiner

Primary Examiner—Bryon P. Gehman
(74) Attorney, Agent, or Firm—Bacon & Thomas, PLLC (57) ABSTRACT

A double-seal mechanism is provided on a cover member for sealing closed a container main body. The double-seal mechanism includes an inner seal piece that seals an interior of the container main body and is positioned between an inner seal reception section of a flange of the container main body and a seal pressing section of the cover. An outer seal piece forms a second seal between the container main body and the periphery of the cover member. The inner seal piece has a rounded distal end fitted into a fitting groove in the flange. A cover member fixing unit of the cover member includes a latch shaft that is linearly projected from and retracted, a latch roller attached to a tip end of the latch shaft, and a crank mechanism that linearly projects and retracts the latch shaft as the crank mechanism rotates. The latch roller travels along an inclined retracting surface on the container main body which forces the cover member inward into sealing engagement with the container main body.

7 Claims, 10 Drawing Sheets

THIN PLATE STORAGE CONTAINER WITH SEAL AND COVER FIXING MEANS

BACKGROUND OF THE INVENTION

1. Field of the Invention

The present invention relates to a thin film storage container which has an improved sealability for sealing a cover and a container main body and an improved detachability.

2. Description of the Related Art

Generally, there is known, as a thin film storage container, a container for storing and transporting semiconductor silicon wafers. As for the wafer storage and transport container, it is important to transport the container while keeping an interior of the container clean in order to prevent contamination of surfaces of the wafers contained therein. To this end, the interior of the container is sealed. That is, a cover member is fixed to a container main body, thereby sealing an interior of the container main body. The sealing of the cover member and the container main body is normally performed by providing a sealant between the cover member and the container main body. This sealant, which is attached to a peripheral edge of the cover member, and which elastically abuts against the container main body using a force of pressing the cover member against the container main body, seals the interior of the container main body.

Since the thin film storage container has a small gap between the cover member and the container main body, the sealant is substantially exposed to the outside. For this reason, a contaminant sometimes enters the container from the outside. This contaminant also enters into an abutment portion between the sealant and the container main body. If the cover member is attached to the container main body, the contaminant does not pose a serious problem. However, when the cover member is detached from the container main body, a problem occurs. Namely, when the cover member is detached from the container main body, an internal pressure of the container main body is temporarily negative, so that the outside air flows into the container main body from the gap formed in the abutment portion between the sealant and the container main body. If the contaminant enters the abutment portion between the sealant and the container main body, the contaminant disadvantageously enters the container main body.

SUMMARY OF THE INVENTION

The present invention has been achieved in light of the conventional disadvantages. It is an object of the present invention to provide a thin plate storage container capable of improving sealability for the sealing between a cover member and a container main body and improving a detachability of the cover member.

According to a first aspect of the present invention, there is provided a thin plate storage container comprising: a container main body which contains and supports a plurality of thin plates; a cover member which closes the container main body, and which keeps an interior of the container main body clean; and a double-seal mechanism that seals the interior of the container main body by the cover member, characterized in that the double-seal mechanism comprises: an inner seal piece attached to a peripheral edge of the cover member, abutting against the container main body, and thereby sealing the interior of the container main body; and an outer seal piece attached to an outside of the inner seal piece on the peripheral edge of the cover member, abutting against the container main body, and thereby sealing an abutment portion between the inner seal piece and the container main body.

With this constitution, the cover member is attached to the container main body, and the inner seal piece abuts against the container main body side, thereby sealing the inside and outside of the container main body from each other. The outer seal piece abuts on the container main body side, thereby covering the abutment portion between the inner seal piece and the container main body from the outside. It is, therefore, possible to prevent a contaminant from entering the abutment portion between the inner seal piece, which seals the inside and outside of the container main body from each other, and the container main body from the outside. As a result, even if the internal pressure of the container main body is temporarily negative when the cover member is detached from the container main body, the external air does not forcibly flow into the container main body from a gap in the abutment portion between the inner seal piece and the container main body since the outer seal piece covers the outside of the abutment portion therebetween. Furthermore, since no contaminant enters the abutment portion, it is possible to ensure preventing the contaminant from entering the container main body when the cover member is detached from the container main body.

According to a second aspect of the present invention, the thin plate storage container according to the first aspect of the present invention is characterized in that the inner seal piece is formed into an annular plate, and an inner end portion of the inner seal in a normal direction is supported by the cover member and extends outward in the normal direction, a seal pressing section that abuts against and presses the outside of the inner seal piece is formed annularly on an inner side surface of the peripheral edge of the cover member, and in that a seal reception section is formed annularly to be opposed to the seal pressing section, the seal reception section abutting against the inner seal piece, which is put between the seal reception section and the seal pressing section, from inside while the cover member is attached to the container main body.

With this constitution, since the inner seal piece is put between the inner seal reception section and the seal pressing section when the cover member is attached to the container main body, it is possible to ensure sealing the interior of the container main body.

According to a third aspect of the present invention, the thin plate storage container according to the first aspect of the present invention is characterized in that a bulge section is formed over an entire periphery of an outer end portion of the inner seal piece of the double-seal mechanism in the normal direction, and in that a fitting groove, into which the bulge section is fitted, is formed in the seal reception section of the container main body.

With this constitution, since the bulge section on the tip end of the inner seal piece is fitted into the fitting groove of the inner seal reception section of the container main body when the cover member is attached to the container main body, it is possible to ensure sealing the interior of the container main body.

According to a fourth aspect of the present invention, there is provided a thin plate storage container comprising: a container main body which contains and supports a plurality of thin plates; a cover member which closes the container main body, and which keeps an interior of the container main body clean; and cover member fixing means, provided at the cover member, for fixing the cover member to the container main body, characterized in that the cover member fixing means comprises: a latch shaft linearly projected from and retracted toward the cover member; and a latch roller rotatably attached to a tip end of the latch shaft, and in that a cover member retracting surface is provided on the container main body, the cover member retracting surface being formed to be inclined to be open outward toward the latch roller, abutting against the latch roller by extension of the latch shaft, and retracting the cover member toward the container main body while rotating.

With this constitution, the latch shaft of the cover member fixing means extends from the cover member, whereby the latch roller on the tip end of the latch shaft abuts against the cover member retracting surface of the roller reception hole of the container main body. If the latch shaft further extends in this state, the latch roller is forced into the cover member retracting surface while rotating. The cover member is thereby retracted into and fixed to the container main body.

According to a fifth aspect of the present invention, there is provided a thin plate storage container comprising: a container main body which contains and supports a plurality of thin plates; a cover member which closes the container main body, and which keeps an interior of the container main body clean; and cover member fixing means, provided at the cover member, for fixing the cover member to the container main body, characterized in that the cover member fixing means is comprised of a crank mechanism for projecting and retracting an engagement piece from and toward the cover member when rotating, the crank mechanism comprises: a rotary plate directly engaged with the engagement piece and rotating, thereby projecting and retracting the engagement piece; and a support piece supporting rotation of the rotary plate, and in that the support piece comprises: a pin reception section individually fitting and supporting a plurality of engagement pins provided on the rotary plate while extending the engagement piece from the cover member; and an elastic support section elastically supporting the plurality of pin reception sections, and adjusting the rotary plate to be located at a set angle at a set position.

With this constitution, while the engagement piece extends from the cover member, the pin reception section of the support piece individually fits and supports a plurality of engagement pins provided on the rotary plate. At this moment, the pin reception section is elastically supported by the elastic support section, and the support piece elastically supports the rotary plate and adjusts the rotary plate to be located at the set angle at the set position. Therefore, even if there is a slight positional deviation of the T-shaped tip end portions of the attachment/detachment arm of the attachment/detachment device relative to the thin plate storage container, the deviation can be absorbed by causing the support piece to elastically support the rotary plate.

According to a sixth aspect of the present invention, the thin plate storage container according to any one of the first to fifth aspects of the present invention is characterized by comprising: a small hole provided in the container main body; a filter which permits pass of only the air between an inside and an outside of the container main body, and which removes a contaminant; and a cover provided outside of the filter.

With this constitution, even if the thin plate storage container is moved or put at various locations, it is possible to prevent the filter from contacting with something and being damaged.

According to a seventh aspect of the present invention, the thin plate storage container according to any one of the first to sixth aspects of the present invention is characterized in that, at an uppermost position of a thin plate support section comprising comb's teeth that support the plurality of thin plates contained in the container main body at certain intervals, respectively, an additional comb's tooth for supporting another thin plate is provided.

With this constitution, one comb's tooth for supporting another thin plate is further provided at the upper post position and the unnecessary semiconductor silicon wafer is used as a cover for the uppermost semiconductor silicon wafer. It is thereby possible to prevent the contaminant or the like from adhering to the uppermost semiconductor silicon wafer.

DETAILED DESCRIPTION OF THE PREFERRED EMBODIMENT

An embodiment of the present invention will be described hereinafter with reference to the accompanying drawings.

This embodiment will be described, while taking a semiconductor silicon wafer storage container for storing and transporting, as thin plates, semiconductor silicon wafers as an example.

Figure 1:
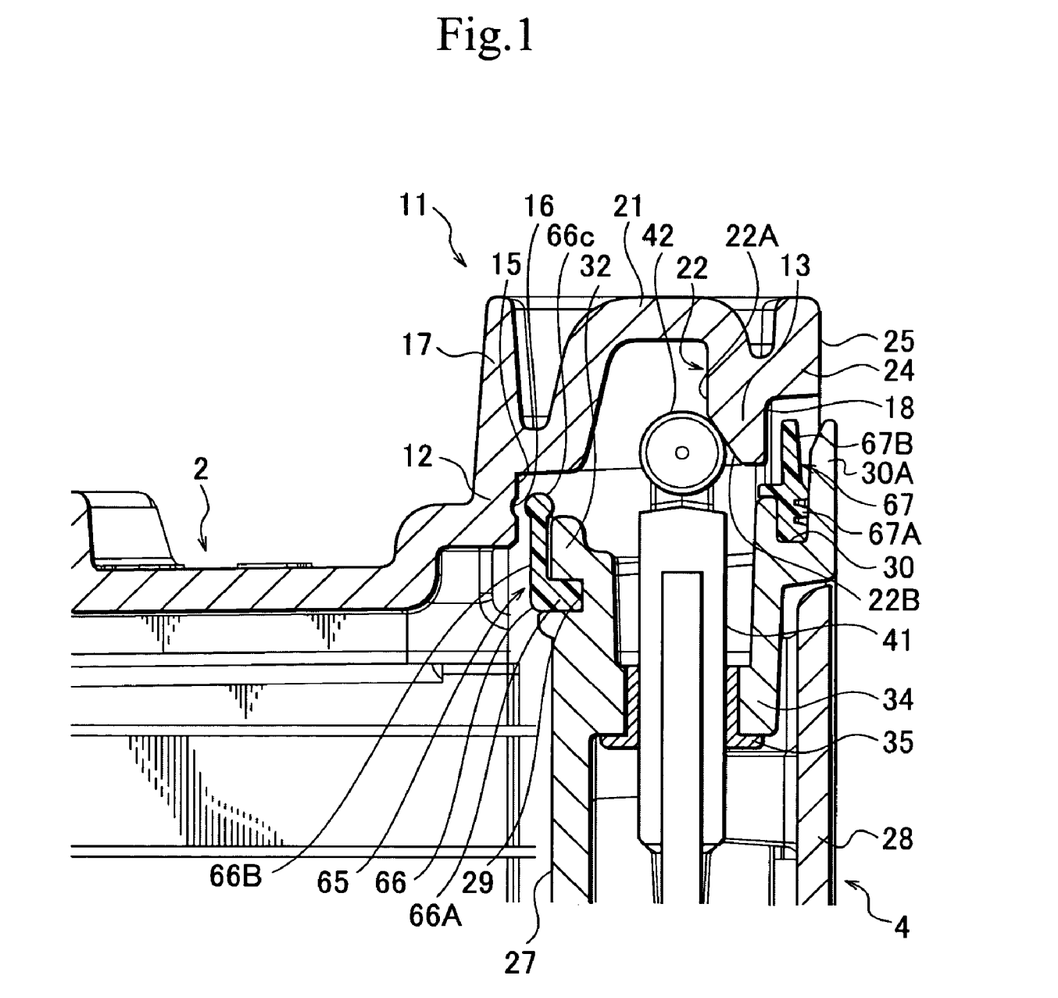
FIG. 1 is an important part cross-sectional view which illustrates a cover member reception section of a semiconductor silicon wafer storage container according to the present invention.
Figure 2:
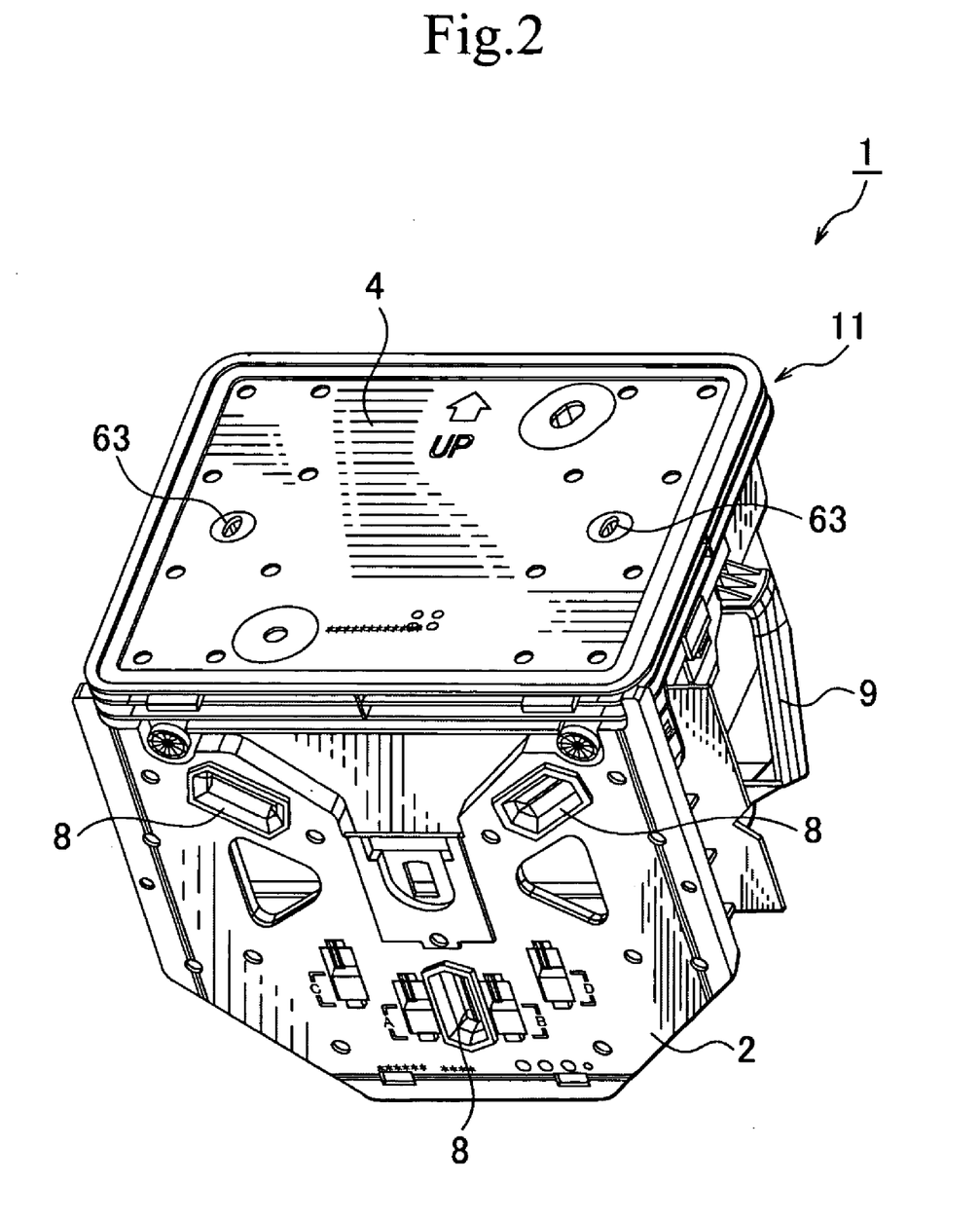
FIG. 2 is a perspective view which illustrates the silicon wafer storage container according to the present invention.
Figure 3:
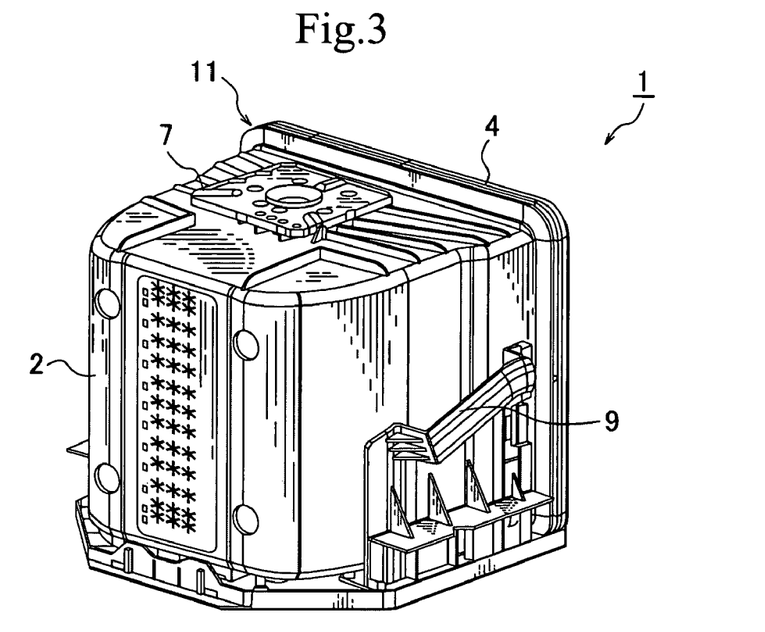
FIG. 3 is a perspective view which illustrates the silicon wafer storage container according to the present invention.
Figure 12:
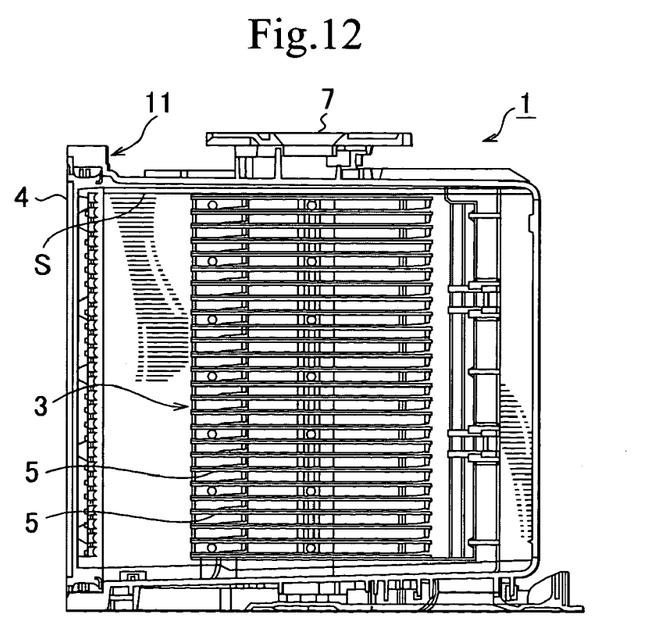
FIG. 12 is a cross-sectional view which illustrates the semiconductor silicon wafer storage container.

As shown in FIGS. 2, 3, and 12, the semiconductor silicon wafer storage container 1 includes a container main body 2 which stores and supports many semiconductor silicon wafers S inside, wafer support sections 3 which are provided on opposed sidewalls in the container main body 2, respectively, and each of which serves as a thin plate support section for holding the many semiconductor silicon wafers S contained in the container main body 2 one piece by one piece from both sides at certain intervals, and a cover member 4 which airtight closes an opening portion of the container main body 2 and which keeps an interior of the container 1 clean.

The entire container main body 2 is generally formed into a cube. The wafer support section 3 is attached to an inside of each sidewall of the container main body 2.

A transport flange section 7 is provided on an end wall on one side (an upper side in FIG. 12) of the container main body 2. The transport section 7 is gripped by an arm of a transport device (not shown) provided on a production line or the like when the transport device transports the container 1. As shown in FIG. 2, positioning fitting sections 8 are provided on an end wall on the other side of the container main body so as to accurately adjust a mounting position of the container 1.

Handles 9 are provided on the both sidewalls of the container main body 2, respectively so that an operator can hold the container main body 2 with operator's hands to carry the container 1 and can put the container 1 vertically.

A cover member reception section 11 is provided on a front end portion (a left end portion in FIG. 12) of the container main body 2 so as to fit the cover member 4 into the container main body 2. AS shown in FIGS. 1, 4, 5, and 6, this cover member reception section 11 is formed by enlarging the end portion of the container main body 2 so as to be adjusted to the cover member 4. This cover member reception section 11 is formed into two steps so as to be suited to a double-seal mechanism 65 to be described later. Specifically, the cover member reception section 11 is comprised of an inner step 12 and an outer step 13.

The inner step 12 is formed to be widened from a front end of the sidewall of the container main body 2 toward an outer periphery of the container main body 2. This inner step 12 constitutes an inner seal reception section 15 on which an inner seal piece 66 of the double-seal mechanism 65 abuts. A fitting groove 16, into which a bulge section 66C on a tip end of the inner seal piece 66 is fitted, is formed in the inner seal reception section 15. The inner step 12 is extended to constitute a grip flange 17. The grip flange 17 is a flange gripped by the operator when the transport device transports the container main body 2.

The outer step 13 is formed on an outside (a right side shown in FIG. 1) of the inner step 12 so as to be deviated by as much as a thickness of the cover member 4. This outer step 13 constitutes an outer seal reception section 18 on which an outer seal piece 67 of the double-seal mechanism 65 abuts.

Roller reception holes 21 are provided between the inner step 12 and the outer step 13. The roller reception holes 21 are provided at four positions corresponding to respective latch rollers 42 to be described later. Each roller reception hole 21 is set to have a size enough to contain the corresponding latch roller 42. An outer side surface 22 of the roller reception hole 21 is comprised of a cover member supporting surface 22A and a cover member retracting surface 22B. The cover member supporting surface 22A, which is formed horizontally,(vertically), is abutted by the corresponding latch roller 42 with the latch roller 42 completely fitting into the roller reception hole 21, thereby fixedly supporting the cover member 4 on the container main body 2. The cover member retracting surface 22B is formed to be inclined so as to be open outward to the corresponding latch roller 42. By so forming, the cover member retracting surface 22B directly presses the latch roller 42 and indirectly presses the cover member 4 against the container main body 2. Namely, when the latch roller 42 enters the roller reception hole 21 in response to the extension of a latch shaft 41 to be described later, the latch roller 42 abuts against the cover member retracting surface 22B, moves deep into an inclined face of the cover member retracting surface 22B while rotating. Thus, the cover member 4 is retracted toward the container main body 2, as seen in state transition from a state shown in FIG. 1 to a state shown in FIG. 6. Another step 24 is provided around the outer step 13 to thereby form an outer end face 25 of the container main body 2. The outer end face 25 of the container main body 2 is set to be flush with an outer end face of the cover member 4 while the latch roller 42 abuts against the cover member supporting surface 22A of the roller reception hole 21 and the cover member 4 is attached to the container main body 2.

As shown in FIGS. 1 to 6, the cover member 4 is formed into a hollow thick plate. Specifically, the cover member 4 is comprised of a shallow plate-like main body section 27 and a cover plate section 28 that closes the main body section 27. An inner gasket support groove 29 and an outer gasket support groove 30 are provided on a peripheral edge of the plate-like main body section 27.

The inner gasket support groove 29 is formed annularly on an inner side surface (a left side surface in FIG. 1) of a peripheral edge of the main body section 27. The inner seal piece 66 having a L-shaped cross section to be described later is extended outward in a normal direction while a proximal end portion of the seal piece 66 is fitted into and supported by the inner gasket support groove 29. On the inner side surface (left side surface in FIG. 1) of the peripheral edge of the main body section 27, a seal pressing section 32 that abuts against and presses an outer side surface of the inner seal piece 66 is formed annularly outward in the normal direction of the inner gasket support groove 29. This seal pressing section 32 presses the outer side surface of the inner seal piece 66, whereby the inner seal piece 66 is put between the seal pressing section 32 and the inner seal reception section 15 of the container main body 2.

The outer gasket support groove 30 is formed annularly on an outer portion (a right portion in FIG. 1) of the peripheral edge of the main body section 27. This outer gasket support groove 30 is constituted as an annular groove that is open outward in the normal direction. An outer wall 30A of the outer gasket support groove 30 is formed to be enlarged so as to cover and protect the outer seal piece 67.

Shaft holes 34 are provided at four positions, respectively between the inner gasket support groove 29 and the outer gasket support groove 30. Each of the shaft hole 34 is intended to slidably support the latch shaft 41 to be described later. A bearing 35 is attached to each shaft hole 34. This bearing 35 is set to be substantially equal in size to a roller support section 41B of the latch shaft 41 so as not to generate an excessively large gap in a sliding portion. This is intended to prevent a contaminant or the like from entering the inner seal piece 66 even if the contaminant is generated in the main body section 27.

As shown in FIGS. 1 and 5 to 10, cover member fixing means 37 is provided in the main body section 27 so as to fix the cover member 4 to the container main body 2. This cover member fixing means 37 is comprised of an engagement piece 38 and a crank mechanism 39.

The engagement piece 38 is comprised of the latch shaft 41 and the latch roller 42. The latch shaft 41 is a shaft that is linearly projected from and retracted toward the main body section 27 of the cover member 4. The latch shaft 41 is comprised of a metallic rod section 41A, the roller support section 41B, and a crank engagement section 41C. The metallic rod section 41A is a member that maintains the strength of the latch shaft 41. The roller support section 41B, which is made of a synthetic resin, is slidably inserted into the bearing 35 of the main body section 27 and supports projective and retractive movements of the latch shaft 41. The crank engagement section 41C is a member engaged with a projection/retraction elongated hole 47 of a rotary plate 45 to be described later. An engagement pin 41D fitted into the projection/retraction elongated hole 47 of the rotary plate 45 is provided on a tip end portion of the crank engagement section 41C.

The latch roller 42 is a member for abutting the cover member 4 against the container main body 2 and fixing the cover member 4 to the container main body 2 without friction. This latch roller 42 is rotatably attached to a tip end of the roller support section 41B.

The crank mechanism 39 is a member for allowing the engagement piece 38 to be projected from or retracted toward the cover member 4 when the crank mechanism 38 rotates. This crank mechanism 39 is comprised of the rotary plate 45 and a support piece 46.

The rotary plate 45 is a member which is engaged with the engagement piece 38 and which allows the engagement piece 38 to be projected from or retracted toward the cover member 4 when the rotary plate 45 rotates. The rotary plate 45 is formed into a disk and provided with two projection/retraction elongated holes 47 helically extending toward a center of the rotary plate 45. The crank engagement section 41C of the latch-shaft 41 is engaged with each projection/retraction elongated hole 47, and attracted toward the center of the rotary plate 45 or forced toward a peripheral edge of the rotary plate 45, thereby projecting or retracting the engagement piece 38. A fitting recess 49 is provided at a core on a surface of the rotary plate 45. This fitting recess 49 is formed to be depressed by protruding surroundings of the recess 49. The fitting recess 49 is a portion into which a T-shaped tip end portion of an attachment/detachment arm of a cover member attachment/detachment device (not shown) is fitted.

On a rear surface of the rotary plate 45, engagement pins 51 are provided at three positions, respectively. Each of the engagement pins 51 is a member, engaged with the support piece 46 to be described later, for adjusting a position and an angle of the rotary plate 45. A rotary shaft 52 is provided at a center of the rear surface of the rotary plate 45.

The support piece 46 is a member for supporting the rotation of the rotary plate 45. The support piece 46 is comprised of U-shaped fixing sections 54, pin reception sections 55, an elastic support section 56, and a rotary shaft hole 57.

The U-shaped fixing sections 54 are members for fixing the support piece 46 to the cover member 4. The U-shaped fixing sections 54 are provided at three positions around the rotary shaft hole 57, and attached to fixing tools 59 of the cover member 4, respectively, thereby fixing the support piece 46 to the side of the cover member 4.

The pin reception sections 55 are members for supporting the rotary plate 45 at a set angle. Namely, while the engagement piece 38 is extended from the cover member 4, the engagement pins 51 of the rotary plate 45 are fitted into and supported by the respective pin reception sections 55, whereby the pin reception sections 55 support the rotary plate 45 at the set angle at a set position. The pin reception sections 55 are formed into V shape and engaged with the engagement pins 51, respectively. The pin reception sections 55 are provided at three positions corresponding to the engagement pins 51 provided at the three positions on the rear surface of the rotary plate 45, respectively.

The elastic support section 56 is a member for elastically supporting the respective pin reception sections 55. The elastic support section 56 is made of a rod material spanning between tip ends of the adjacent U-shaped fixing sections 54. This elastic support section 56 has elasticity, so that the elastic support section 56 elastically supports the pin reception sections 55 by tip end portions thereof while proximal end portions are supported by the respective U-shaped fixing sections 54. The elastic support section 56 thereby elastically supports the respective pin reception sections 55 at set positions, adjusts the rotary plate 45 to be located at its set angle at its set position through the engagement pins 51 engaged with the respective pin reception sections 55, and thereby supports the rotary plate 45. Reference symbols 60 and 61 denote stoppers that restrict the rotation of the rotary plate 45. By abutting the engagement pins 51 against the stoppers 60 and 61, the unnecessary rotation of the rotary plate 45 is restricted.

The rotary shaft hole 57 is a member for supporting the rotation of the rotary plate 45. An inside diameter of the rotary shaft hole 57 is set slightly larger than an outside diameter of the rotary shaft 52 of the rotary plate 45, thereby providing the rotary plate 45 with play. Even if the semiconductor silicon wafer storage container 1 is slightly deviated from the T-shaped tip end portions of the attachment/detachment arm of the cover member attachment/detachment device, this play can absorb the deviation.

The two cover member fixing means 37 are provided respectively at two positions in the main body section 27, to enable the four engagement pieces 38 to be projected from and retracted toward neighborhoods of four corners of the cover member 4, respectively.

The cover plate section 28 is a member that covers and closes the main body section 27 including the cover member fixing means 37. The cover plate section 28 is formed into a rectangular plate, and provided with elongated holes 63 into which the T-shaped tip end portions of the attachment/detachment arm of the attachment/detachment device are inserted, respectively. The elongated holes 63 are provided at two positions to correspond to the engagement pieces 38 of the two cover member fixing means 37 provided in the main body section 27, respectively. By providing the elongated holes 63, the two T-shaped tip end portions of the attachment/detachment arm of the attachment/detachment device are inserted into the elongated holes 63, and fitted into the fitting recesses 49 of the cover member fixing means 37 provided in the main body section 27, respectively.

The double-seal mechanism 65 that seals the interior of the container main body 2 is provided on the peripheral edge of the cover member 4. This double-seal mechanism 65 is comprised of the inner seal piece 66 and the outer seal piece 67.

The inner seal piece 66 is a member that seals the interior of the container main body 2. This inner seal piece 66 is attached to the peripheral edge of the cover member 4, and abuts against the container main body 2, thereby sealing the interior of the container main body 2. The inner seal piece 66 is formed into a generally annular plate having an L-shaped cross section. The inner seal piece 65 is comprised of a support section 66A which is fitted into the inner gasket support groove 29 of the cover member 4, and an extension section 66B which is put between the container main body 2 and the cover member 4 and which seals the interior of the container main body 2. The support member 66A is fitted into the inner gasket support groove 29 of the cover member 4, whereby the inner seal piece 66 is supported by the cover member 4. While the support section 66A is fitted into the inner gasket support groove 29 of the cover member 4, the extension section 66B is provided to extend outward in the normal direction. The extension section 66B is provided to cover the seal pressing section 32 while being provided to extend outward in the normal direction. The bulge section 66C fitted into the fitting groove 16 is formed on a tip end of the extension section 66B. The bulge section 66C is formed by expanding the tip end of the extension section 66B so as to have a circular cross section.

The outer seal piece 67 is a member that seals the abutment portion between the inner seal piece 66 and the container main body 2. This outer seal piece 67 is formed into a generally annular plate, and fitted into the outer gasket support groove 30. The outer seal piece 67 is thereby attached to cover an outside of the inner seal piece 66. The outer seal piece 67 is comprised of a proximal fitting section 67A and a distal abutment section 67B. The proximal fitting section 67A is fitted into the outer gasket support groove 30 of the cover member 4, and supports the outer seal piece 67 toward the cover member 4. The distal abutment section 67B abuts against the outer step 13 of the container main body 2, thereby sealing the abutment portion between the inner seal piece 66 and the inner seal reception section 15 of the container main body 2.

Figure 4:
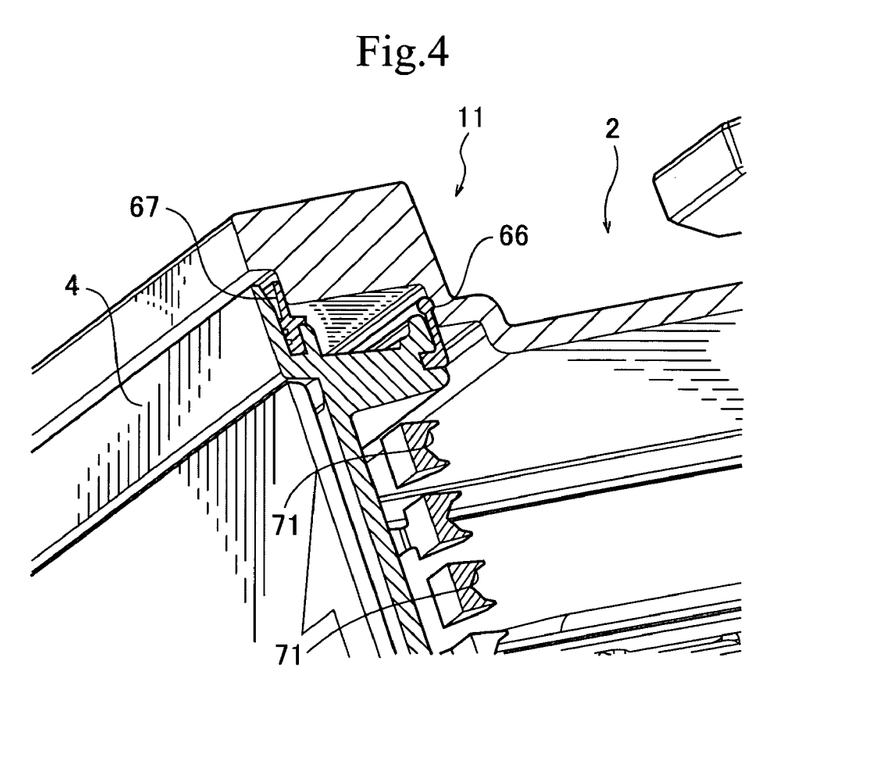
FIG. 4 is an important part cross-sectional view which illustrates the cover member reception section of the silicon wafer storage container according to the present invention.
Figure 5:
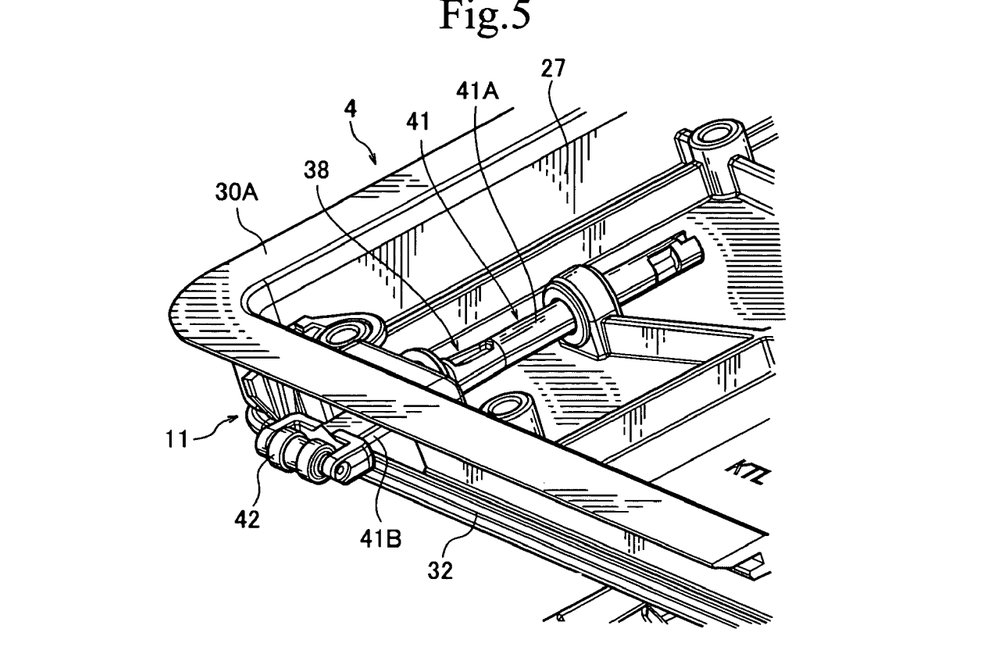
FIG. 5 is an important part cross-sectional view which illustrates the cover member reception section of the silicon wafer storage container according to the present invention.
Figure 6:
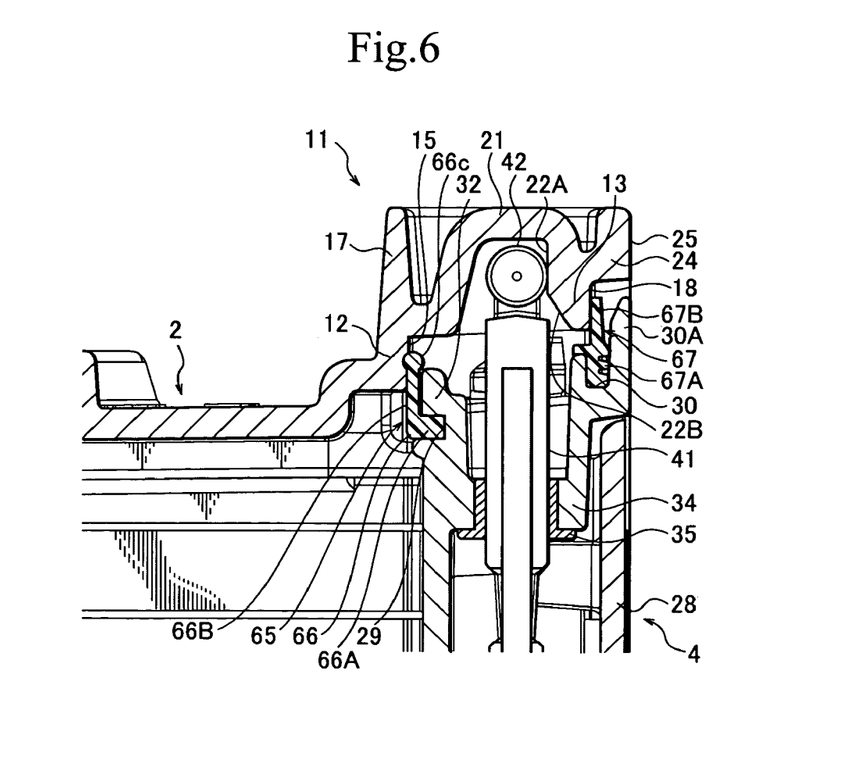
FIG. 6 is an important part cross-sectional view which illustrates the cover member reception section of the silicon wafer storage container according to the present invention.
Figure 7:
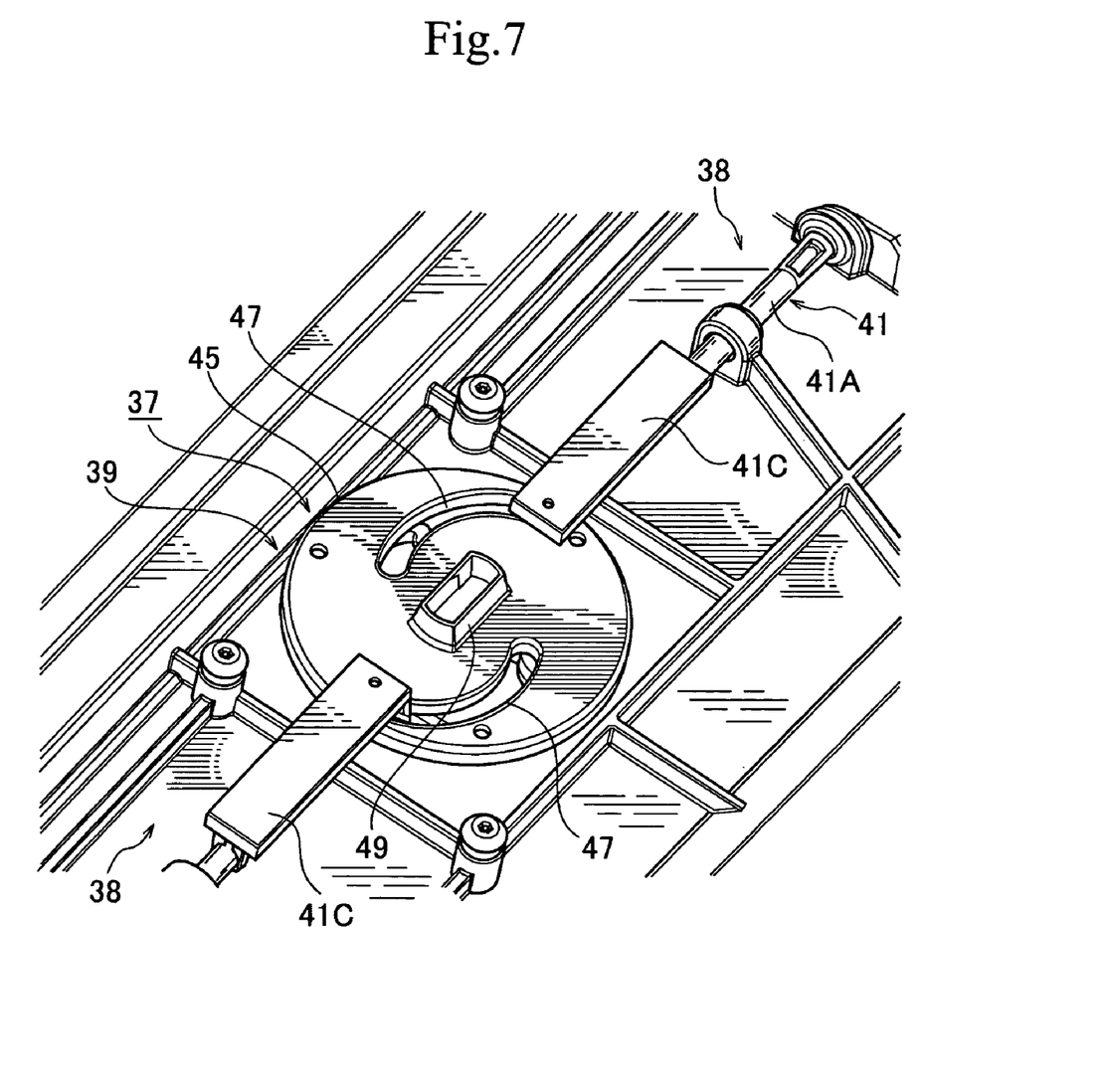
FIG. 7 is an important part perspective view which illustrates a crank mechanism of cover member fixing means.
Figure 8:
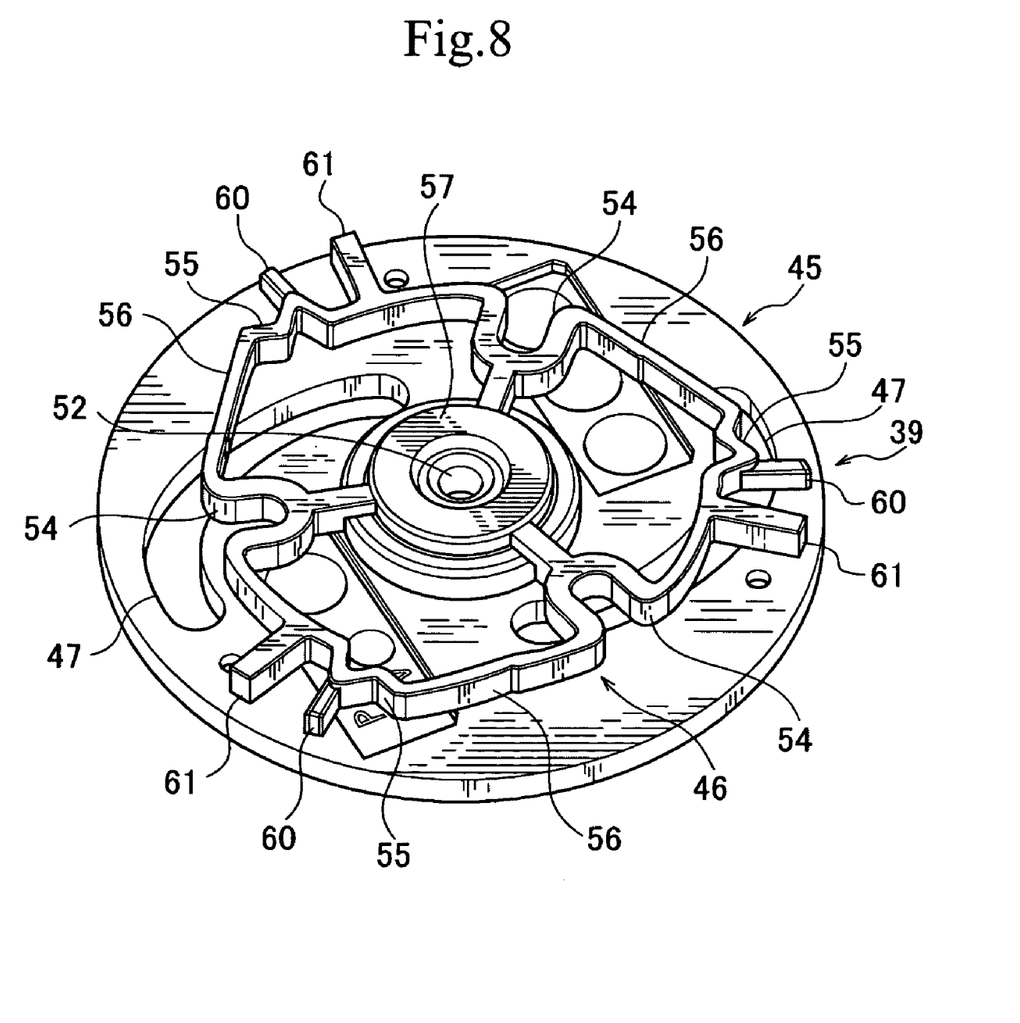
FIG. 8 is an important part perspective view which illustrates the crank mechanism of the cover member fixing means.
Figure 9:
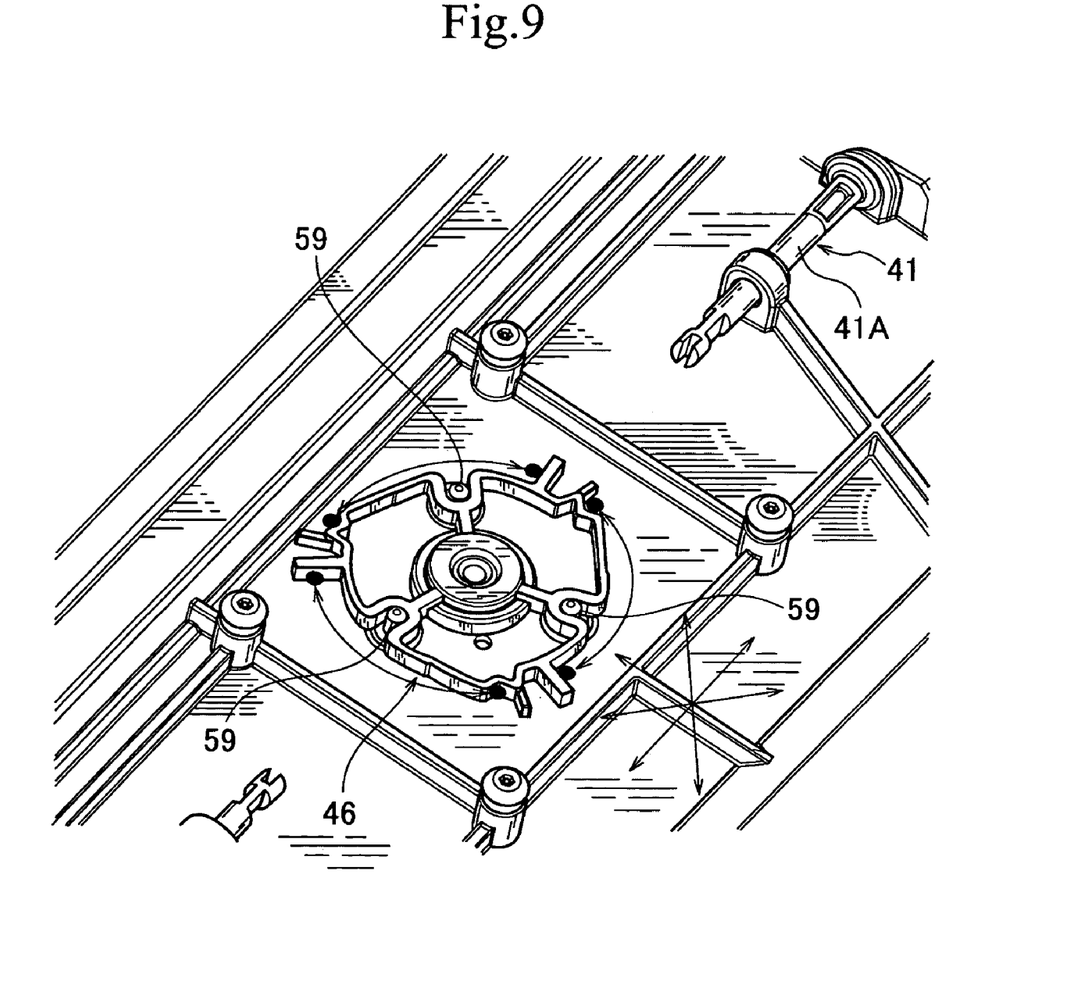
FIG. 9 is a perspective view which illustrates a support piece of the crank mechanism of the cover member fixing means.
Figure 10:
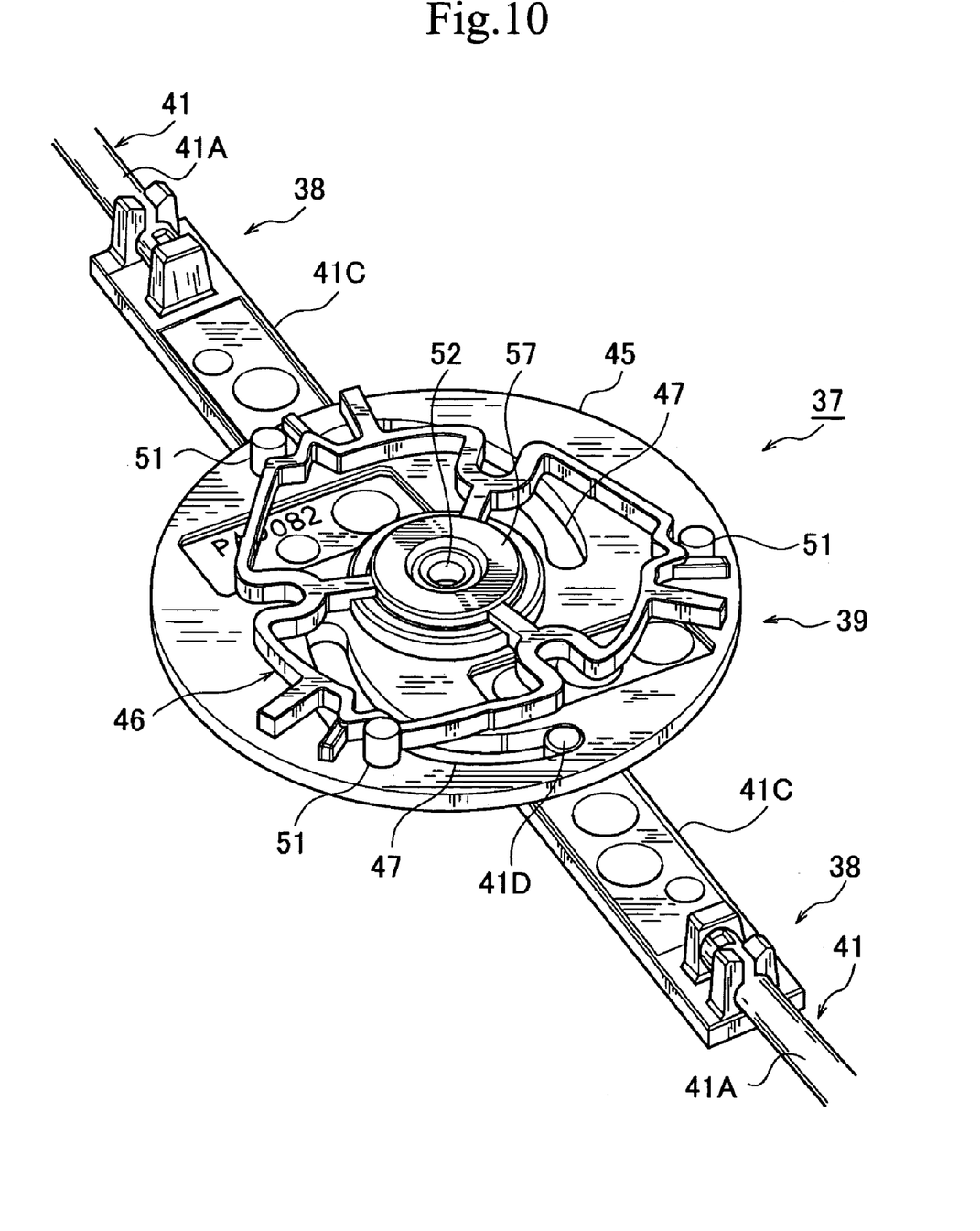
FIG. 10 is an important part perspective view which illustrates the crank mechanism of the cover member fixing means.

As shown in FIG. 4, wafer pressers 71 are attached to an inner surface of the cover member 4.

Figure 11:
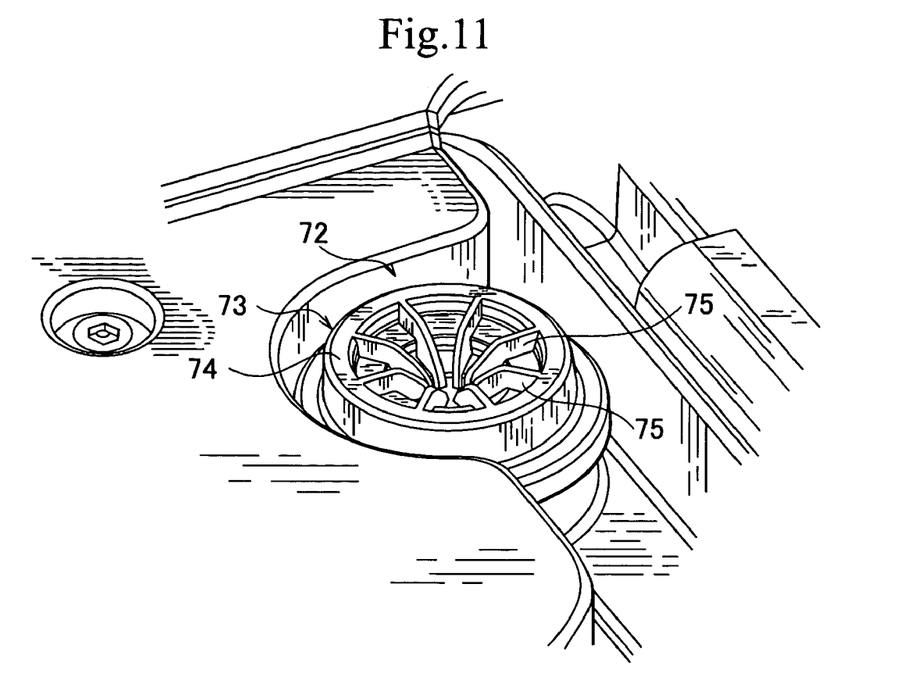
FIG. 11 is a perspective view which illustrates a filter.

As shown in FIGS. 2 and 11, a small hole (not shown) is formed on a mount surface of the container main body 2, and a filter 72 is attached to the small hole. This filter 72 is a member that removes the contaminant or the like between inside and outside of the container main body 2 and that permits only the air to enter the container main body 2. A cover 73 for protecting the filter 72 is provided outside of the filter 72. This cover 73 is comprised of an annular section 74 covering surroundings of the filter 72 and radial protection arm sections 75 extending from this annular section 74 toward a center of the cover 73.

As shown in FIG. 12, each of the wafer support sections 3 attached into the container main body 2 includes many comb's teeth 5 that are arranged in parallel at certain intervals and that support the semiconductor silicon wafers S at certain intervals, respectively. Since the number of the semiconductor silicon wafers S supported in the container main body 2 is fixed according to a standard, so that the number of the comb's teeth 5 is fixed, accordingly. The comb's tooth 5 corresponding to one semiconductor silicon wafer S is further provided on the uppermost comb's tooth 5. This is intended to protect the uppermost semiconductor silicon wafer S. Namely, the contaminant or the like often adheres to an upper side surface of the uppermost semiconductor silicon wafer S among a plurality of semiconductor silicon wafers S contained in the container 1. Therefore, if an unnecessary semiconductor silicon wafer S is stored in the container 1 to be put on the upper side surface of the uppermost semiconductor silicon wafer S, the contaminant or the like adheres to the unnecessary semiconductor silicon wafer S, making it possible to prevent the contaminant or the like from adhering to the uppermost semiconductor silicon wafer S.

[Function]

The semiconductor silicon wafer storage container 1 constituted as stated above is used as follows.

In order to contain the semiconductor silicon wafers S in the container main body 2, the two T-shaped tip end portions of the attachment/detachment arm of the cover member attachment/detachment device are inserted first into the respective elongated holes 63, and fitted into the fitting recesses 49 of the rotary plate 45 of the cover member fixing means 37. At this moment, the rotary plate 45 is elastically supported by the support piece 46 to be adjusted to be located at the set angle at the set position. Therefore, the T-shaped tip end portions are smoothly fitted into the fitting recesses 49 without contacting with the recesses 49. While being fitted into the fitting recesses 49, the T-shaped tip end portions are rotated and the latch roller 42 is retracted toward the cover member 4 through the latch shaft 41. As a result, the latch roller 42 is detached from the roller reception hole 21, the cover member 4 is unfixed from the container main body 2, and the cover member attachment/detachment device detaches the cover member 4 from the container main body 2.

Next, the semiconductor silicon wafers S are installed into the container main body 2 by the transport device. In this case, after the semiconductor silicon wafers S of a set number are installed, the unnecessary semiconductor silicon wafer S that may be contaminated with the contaminant or the like is provided on an uppermost position.

The cover member attachment/detachment device attaches the cover member 4 to the container main body 2. Specifically, the cover member 4 is inserted into the cover member reception section 11 of the container main body 2, and the rotary plate 45 of the cover member fixing mean 37 is rotated. As a result, the latch shaft 41 extends outward from the cover member 4, and the latch roller 42 abuts on the cover member retracting surface 22B of the roller reception hole 21. The latch roller 42 is further forced inside while abutting on the retracting surface 22B. The latch roller 42 is forced even into the cover member supporting surface 22A while press-contacting the cover member retracting surface 2B, whereby the cover member 4 is retracted toward and fixed as seen in the state transition from the state shown in FIG. 1 to the state shown in FIG. 6. Accordingly, the inner seal piece 66 of the double-seal mechanism 65 abuts against the inner seal reception section 15, and the outer seal piece 67 thereof abuts against the outer seal reception section 18. Further, the bulge section 66C of the inner seal piece 66 is fitted into the fitting groove 16, and the extension section 66B is put between the inner seal reception section 15 and the seal pressing section 32, thereby ensuring sealing the interior of the container main body 2. In addition, by causing the outer seal piece 67 to abut against the outer seal reception section 18, the abutment portion between the inner seal piece 66 and the inner seal reception section 15 is sealed, thereby preventing the contaminant or the like from entering the abutment portion between the inner seal piece 66 and the inner seal reception section 15 from the outside during transport.

In this state, the fitting recess 49 of the rotary plate 45 is matched to each elongated hole 63, and the T-shaped tip end portions are pulled out as they are. The semiconductor silicon wafer storage container 1 is then transported to a predetermined location.

During the transport, even if the contaminant or the like floats around the semiconductor silicon wafer storage container 1, the contaminant or the like does not enter the abutment portion between the inner seal piece 66 and the inner seal reception section 15 since the outer seal piece 67 abuts on the outer seal reception section 18.

In order to detach the cover member 4 from the container main body 2 at a destination, the two T-shaped tip end portions of the attachment/detachment arm of the cover-member attachment/detachment device are inserted into the respective elongated holes 63, and fitted into the fitting recesses 49 of the rotary plate 45 of the cover fixing means 37. At this moment, the rotary plate 45 is elastically supported by the support piece 46 to be adjusted to be located at the set angle at the set position. Therefore, the T-shaped tip end portions are smoothly fitted into the fitting recesses 49 without contacting with the recesses 49. While being fitted into the fitting recesses 49, the T-shaped tip end portions are rotated and the latch roller 42 is retracted toward the cover member 4 through the latch shaft 41. As a result, the latch roller 42 is detached from the roller reception hole 21, the cover member 4 is unfixed from the container main body 2, and the cover member attachment/detachment device detaches the cover member 4 from the container main body 2.

When detaching the cover member 4 from the container main body 2, the internal pressure of the container main body 2 becomes instantaneously negative. Due to this, even if the air outside of the inner seal piece 66 flows into the container main body 2, the contaminant or the like is hardly present in the abutment portion between the inner seal piece 66 and the inner seal reception section 15, thereby preventing the contaminant or the like from entering the container main body 2.

Although the semiconductor silicon wafer storage container 1 is mounted at various locations during transport, the container 1 is not damaged since the cover 73 is provided on the filter 72.

[Advantages]

As stated so far, since the storage container 1 includes the double-seal mechanism 65, it is possible to ensure preventing the contaminant from entering the container main body 2 when the cover member 4 is detached from the container main body 2.

Since the inner seal piece 66 is put between the inner seal reception section 15 and the seal pressing section 32, it is possible to ensure sealing the interior of the container main body 2.

Since the bulge section 66C on the tip end of the inner seal piece 66 is fitted into the fitting groove 16 of the inner seal reception section 15 of the container main body 2, it is possible to ensure sealing the interior of the container main body 2.

The latch shaft 41 of the cover member fixing means 37 extends from the cover member 4, and the latch roller 42 on the tip end of the latch shaft 41 abuts against the cover member retracting surface 22B of the roller reception hole 21 of the container main body 2 and is forced inside while rotating, whereby the cover member 4 is retracted toward the container main body 2. It is, therefore, possible to ensure fixing the cover member 4 to the container main body 2.

The support piece 46 elastically supports the rotary plate 45 and adjusts the rotary plate 45 to be located at the set angle at the set position. Therefore, even if there is a slight positional deviation of the T-shaped tip end portions of the attachment/detachment arm of the attachment/detachment device relative to the semiconductor silicon wafer (thin plate) storage container, the deviation can be absorbed and the cover member 4 can be detached from the container main body 2 smoothly.

The cover 73 is provided outside of the filter 72. Therefore, even if the semiconductor silicon wafer (thin plate) storage container 1 is moved or put at various locations, it is possible to prevent the filter 72 from contacting with something and being damaged.

Since the unnecessary semiconductor silicon wafer S is used as a cover for the uppermost semiconductor silicon wafer S, it is possible to prevent the contaminant or the like from adhering to the uppermost semiconductor silicon wafer S.

[Modification]

(1) In the embodiment, the example of using the semiconductor silicon wafer S as the thin plate has been described. However, the thin plate is not limited to the semiconductor silicon wafer S but may be any thin plate, such as a liquid crystal glass plate or a storage disk, which may possibly be adversely influenced by gas, fine particles, and the like.

Figure 13:
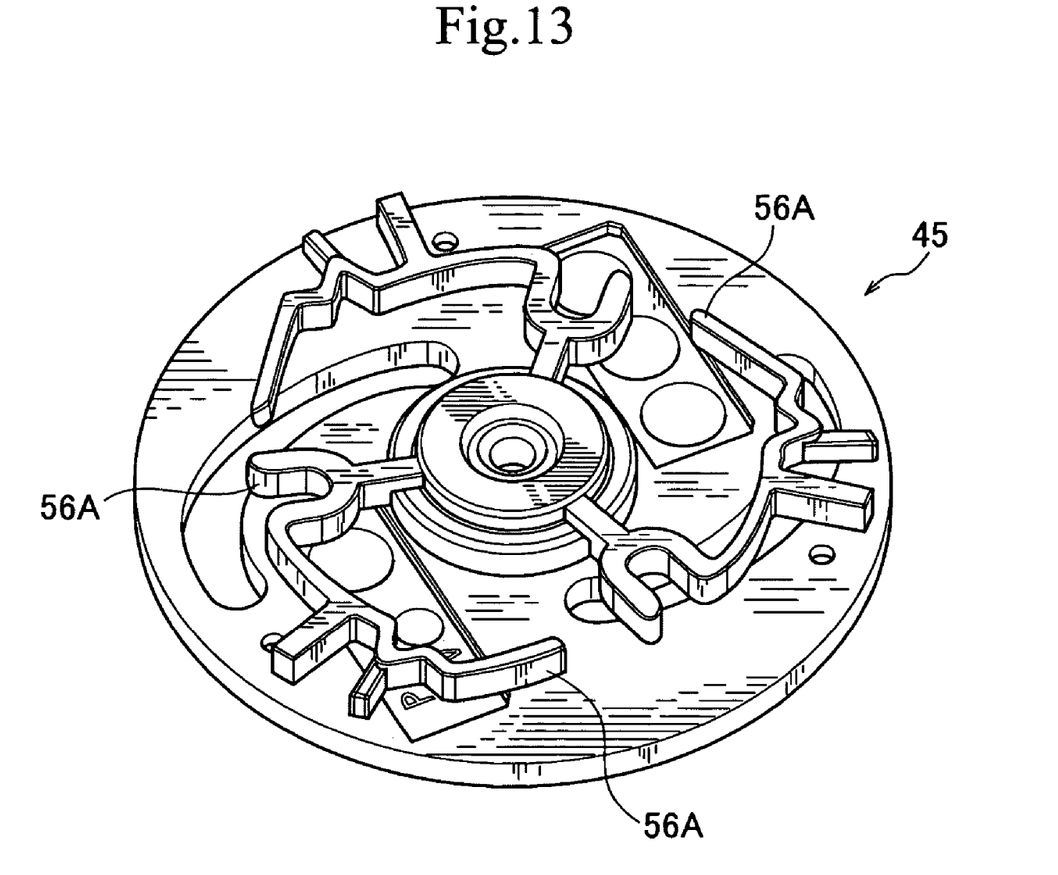
FIG. 13 is a perspective view which illustrates a modification of the semiconductor silicon wafer storage container according to the present invention.

(2) In the embodiment, the elastic support section 56 of the support piece 46 is connected to the adjacent U-shaped fixing sections 54. Alternatively, the elastic support section 56 may be formed into another shape so as to secure necessary elasticity. For example, as shown in FIG. 13, an elastic support section 56A may be cut off halfway so as to secure higher elasticity.

As stated so far in detail, the storage container of the present invention exhibits the following advantages.

Since the storage container includes the double-seal mechanism, it is possible to ensure preventing the contaminant from entering the container main body when the cover member is detached from the container main body.

Since the inner seal piece is put between the inner seal reception section and the seal pressing section, it is possible to ensure sealing the interior of the container main body.

Since the bulge section on the tip end of the inner seal piece is fitted into the fitting groove of the inner seal reception section of the container main body, it is possible to ensure sealing the interior of the container main body.

The latch shaft of the cover member fixing means extends from the cover member, and the latch roller on the tip end of the latch shaft abuts against the cover member retracting surface of the roller reception hole of the container main body and is forced into the surface while rotating, whereby the cover member is retracted into the container main body. It is, therefore, possible to ensure fixing the cover member to the container main body.

The support piece elastically supports the rotary plate and adjusts the rotary plate to be located at the set angle at the set position. Therefore, even if there is a slight positional deviation of the T-shaped tip end portions of the attachment/detachment arm of the attachment/detachment device relative to the thin plate storage container, the deviation can be absorbed and the cover member can be detached from the container main body smoothly.

The cover is provided outside of the filter. Therefore, even if the thin plate storage container is moved or put at various locations, it is possible to prevent the filter from contacting with something and being damaged.

Since the unnecessary semiconductor silicon wafer is used as a cover for the uppermost semiconductor silicon wafer, it is possible to prevent the contaminant or the like from adhering to the uppermost semiconductor silicon wafer.

What is claimed is:

1. A thin plate storage container comprising:
    a container main body defining an interior for containing and supporting a plurality of thin plates, said container main body having a flange defining an opening for insertion and removal of the thin plates;
    a cover member extending in a lateral direction across and closing the opening of the container main body to keep the interior of the container main body clean, said cover member having a double-seal mechanism for sealing the interior of the container main body, the double-seal mechanism comprising:
an annular inner seal piece attached to a peripheral edge of the cover member, abutting against the container main body, and thereby sealing the interior of the container main body, the inner seal piece comprising a support portion fixed to the cover member and defining the inner peripheral edge of the annular inner seal piece, a connecting portion integral with and freely extending laterally outward from the support portion, and a rounded distal end portion of a diameter greater than the thickness of the connecting portion, integral with the connecting portion and defining a peripheral edge of the inner seal piece;
an outer seal piece attached to the peripheral edge of the cover member outward of the inner seal piece relative to the interior of the container main body, abutting against the container main body, and thereby sealing the container main body;
an inner peripheral lip portion of said cover member that serves as a seal pressing portion, that abuts against and presses the inner seal piece against an annular seal reception inner step that is formed in said flange opposed to the seal pressing portion, when the cover member is attached to the container main body.

2. The thin plate storage container according to claim 1, wherein the double-seal mechanism further comprises:
a fitting groove, into which the rounded end portion of annular inner seal piece is fitted, formed in the annular seal reception inner step of the flange of the container main body.

3. The thin plate storage container according to claim 1, further having:
a small hole provided in the container main body;
a filter which permits passage of only air between and inside and an outside of the container main body, and which removes a contaminant; and
a cover provided outside of the filter.

4. The thin plate storage container according to claim 1 further comprising:
thin plate support sections comprising comb's teeth and mounted within the container main body for support, at intervals, of the plurality of thin plates within in the container main body.

5. The thin plate storage container according to claim 1 wherein the outer seal piece extends laterally outward, from a base end seated within the cover member, in parallel with and spaced from the connecting portion of the inner seal piece.

6. A thin plate storage container comprising:
a container main body defining an interior for containing and supporting a plurality of thin plates, said container body having a flange defining an opening for insertion and removal of the thin plates;
a cover member extending laterally across and closing the opening of the container main body to keep the interior of the container main body clean, said cover member having cover member fixing means for fixing the cover member to the container main body, wherein the cover member fixing means comprises:
a latch shaft mounted in the cover member for linear, reciprocating motion between an extended position where the cover is locked to the container and a retracted position wherein the cover member is unlocked from the container main body; and
a latch roller rotatably attached to a distal end of the latch shaft, and
a cover member retracting surface provided on the container main body, the cover member retracting surface being inclined to open outward and, abutting against the latch roller, whereby extension of the latch shaft forces the cover member in the container main body.

7. A thin plate storage container comprising:
a container main body defining an interior for containing and supporting a plurality of thin plates, said container having a flange defining an opening for insertion and removal of the thin plates;
a cover member extending in a lateral direction across and closing the opening of the container main body to keep the interior of the container main body clean, said cover member having cover member fixing means for fixing the cover member to the container main body, wherein
the cover member fixing means comprises:
a rotatable crank mechanism fixed to said cover member for projecting and retracting an engagement piece between an engaged position wherein the cover member is locked to the container main body and a retracted position wherein the cover member is unlocked from the container main body, wherein the crank mechanism comprises:
a rotary plate directly engaged with the engagement piece for the projecting and retracting of the engagement piece upon rotation of the rotary plate; and
a support piece supporting rotation of the rotary plate wherein the support piece comprises:
pin reception sections individually receiving and elastically holding a plurality of engagement pins provided on the rotary plate; and
elastic support sections elastically biasing the pin reception sections into engagement with the plurality of engagement pins, thereby holding the rotary plate at a set angle of rotation.

* * * * *

UNITED STATES PATENT AND TRADEMARK OFFICE
CERTIFICATE OF CORRECTION

PATENT NO.       : 7,077,270 B2
APPLICATION NO.  : 10/796114
DATED            : July 18, 2006
INVENTOR(S)      : Chiaki Matsutori

It is certified that error appears in the above-identified patent and that said Letters Patent is hereby corrected as shown below:

On Title Page Item (57)
In the ABSTRACT, line 11, "projected from and" should read -- projected and --.

Column 13, line 37, "and" should read -- an --.

Signed and Sealed this

Nineteenth Day of December, 2006

JON W. DUDAS
*Director of the United States Patent and Trademark Office*